United States Patent
Ingle (10) Patent No.: US 9,780,151 B2
(45) Date of Patent: Oct. 3, 2017

(54) RADIATION-EMITTING DEVICE AND METHOD OF PRODUCING SAME

(71) Applicant: OSRAM OLED GmbH, Regensburg (DE)

(72) Inventor: Andrew Ingle, Allershausen (DE)

(73) Assignee: OSRAM OLED GmbH (DE)

( * ) Notice: Subject to any disclaimer, the term of this patent is extended or adjusted under 35 U.S.C. 154(b) by 0 days.

(21) Appl. No.: 15/023,725

(22) PCT Filed: Sep. 18, 2014

(86) PCT No.: PCT/EP2014/069914
§ 371 (c)(1),
(2) Date: Mar. 22, 2016

(87) PCT Pub. No.: WO2015/044029
PCT Pub. Date: Apr. 2, 2015

(65) Prior Publication Data
US 2016/0233276 A1   Aug. 11, 2016

(30) Foreign Application Priority Data
Sep. 26, 2013   (DE) .................. 10 2013 110 666

(51) Int. Cl.
*H01L 27/32*   (2006.01)
*H01L 51/56*   (2006.01)
(Continued)

(52) U.S. Cl.
CPC .......... *H01L 27/3239* (2013.01); *H01L 51/56* (2013.01); *H01L 51/0023* (2013.01);
(Continued)

(58) Field of Classification Search
CPC .................................................. H01L 27/3239
See application file for complete search history.

(56) References Cited

U.S. PATENT DOCUMENTS 4,217,579 A * 8/1980 Hamada .................. G09G 3/16
345/204
5,169,672 A * 12/1992 Harima .................. G02B 5/201
257/E31.121
(Continued)

FOREIGN PATENT DOCUMENTS

DE     103 21 152 A1    12/2004
DE   10 2008 023 874 A1    8/2009
(Continued)

*Primary Examiner* — Erik Kielin
(74) *Attorney, Agent, or Firm* — DLA Piper (US)

(57) ABSTRACT

A radiation-emitting device includes a substrate; and at least one layer sequence arranged on the substrate that generates electromagnetic radiation, including at least one first electrode area, at least one second electrode area, and at least one functional layer between the first electrode area and the second electrode area, wherein the functional layer generates electromagnetic radiation in a switched-on operating state, and at least one removal region is arranged between at least two points of the first electrode area conductively connected to one another by the first electrode area, the first electrode area being at least partly removed in the at least one removal region.

16 Claims, 2 Drawing Sheets

(51) Int. Cl.
 *H01L 51/00* (2006.01)
 *H01L 51/52* (2006.01)
(52) U.S. Cl.
 CPC .. *H01L 51/5209* (2013.01); *H01L 2251/5361* (2013.01); *H01L 2933/0016* (2013.01)

(56) References Cited

U.S. PATENT DOCUMENTS

| | | |
|---|---|---|
| 5,279,702 A | 1/1994 | Douglas |
| 2001/0055454 A1* | 12/2001 | Roach ................... G09F 9/305 385/123 |
| 2005/0035361 A1* | 2/2005 | Peterson ............ H01L 51/5281 257/98 |
| 2011/0012140 A1* | 1/2011 | Grabowski ............ G09F 13/22 257/88 |
| 2013/0092914 A1* | 4/2013 | Lifka .................. H01L 51/0021 257/40 |

FOREIGN PATENT DOCUMENTS

| | | |
|---|---|---|
| DE | 10 2009 022 902 A1 | 10/2010 |
| EP | 1 154 398 A2 | 11/2001 |
| EP | 1 507 444 A1 | 2/2005 |
| EP | 1 691 429 B1 | 8/2006 |
| WO | 99/16289 A1 | 4/1999 |
| WO | 01/08451 A1 | 2/2001 |
| WO | 2011/119707 A9 | 9/2011 |

\* cited by examiner

RADIATION-EMITTING DEVICE AND METHOD OF PRODUCING SAME

TECHNICAL FIELD

This disclosure relates to a radiation-emitting device and a method of producing the same.

BACKGROUND

Radiation-emitting devices are suitable as large-area, thin luminous elements. In many applications it is desirable for the intensity of the emitted electromagnetic radiation to vary across the luminous area. By way of example, a location-dependent radiation intensity can be used to represent information on a plate, for example, by arrangement of regions having different radiation intensities in the form of text or symbols.

It is known to achieve different radiation intensities in radiation-emitting devices by different regions of the device being driven with different voltages in a targeted manner. As a result, a location- and time-dependent intensity distribution can be achieved. However, a complex control of the different voltages and a complex structure of applying the different voltages to different parts of the device are required.

It is also known to design only specific regions of a radiation-emitting device to emit radiation. That solution does not allow continuous transitions in the intensity profile and requires an areal variation in the construction of the radiation-emitting device.

It could therefore be helpful to provide a radiation-emitting device in which the radiation intensity varies spatially, and a method of producing the radiation-emitting device. In particular, it could be helpful to enable continuous transitions in the radiation intensity without necessitating targeted driving of different parts of the radiation-emitting device with different voltages.

SUMMARY

I provide a radiation-emitting device including a substrate; and at least one layer sequence arranged on the substrate that generates electromagnetic radiation, including at least one first electrode area, at least one second electrode area, and at least one functional layer between the first electrode area and the second electrode area, wherein the functional layer generates electromagnetic radiation in a switched-on operating state, and at least one removal region is arranged between at least two points of the first electrode area conductively connected to one another by the first electrode area, the first electrode area being at least partly removed in the at least one removal region.

I also provide a method of producing a radiation-emitting device including providing a first electrode area on a substrate, at least partly removing the first electrode area in at least one removal region, applying at least one functional layer that generates electromagnetic radiation in a switched-on operating state, on the first electrode area, and applying a second electrode area on the at least one functional layer, wherein, during the process of at least partly removing the first electrode area, at least one removal region is arranged between at least two points of the first electrode area conductively connected to one another by the first electrode area.

I further provide a radiation-emitting device including a substrate; and at least one layer sequence arranged on the substrate that generates electromagnetic radiation, including at least one first electrode area, at least one second electrode area, and at least one functional layer between the first electrode area and the second electrode area, wherein the functional layer generates electromagnetic radiation in a switched-on operating state, and at least one removal region is arranged between at least two points of the first electrode area conductively connected to one another by the first electrode area, the first electrode area being partly removed in the at least one removal region, the first electrode area having a thickness in the at least one removal region smaller than a thickness of the first electrode area, where it is not removed and completely present.

DETAILED DESCRIPTION

My radiation-emitting device may comprise a substrate and at least one layer sequence arranged on the substrate and suitable to generate electromagnetic radiation. The layer sequence comprises at least one first electrode area, at least one second electrode area and at least one functional layer between the first electrode area and the second electrode area, wherein the functional layer generates electromagnetic radiation in a switched-on operating state. At least one removal region is arranged between at least two points of the first electrode area conductively connected to one another by the first electrode area, the first electrode area being at least partly removed in the at least one removal region.

A "region" means a region of the area of the radiation-emitting device, that is to say that a region extends in two dimensions in which the electrode areas and the functional layer are areal. A region in which the first electrode area is at least partly removed means a region in which the first electrode area either is not present at all or has at least a smaller thickness, preferably at most half of its nominal thickness. A region in which the first electrode area is not removed means a region in which the first electrode area either is completely present or has at least a larger thickness than in the removal regions, preferably at least half of its nominal thickness. The nominal thickness of the first electrode area means the maximum thickness of the first electrode area, that is to say that thickness which the first electrode area has where it is embodied completely and is not removed.

The fact that one layer or one element is arranged or applied "on" or "above" another layer or another element or else "between" two other layers or elements can mean that the one layer or the one element is arranged directly in direct mechanical and/or electrical contact on the other layer or the other element. Furthermore, it can also mean that the one layer or the one element is arranged indirectly on or above the other layer or the other element. In this case, further layers and/or elements can then be arranged between the one layer and the other layer or the one element and the other element.

The first electrode area and/or the second electrode area preferably comprise(s) a transparent conductive oxide (TCO). Transparent conductive oxides are transparent conductive materials, generally metal oxides such as, for example, zinc oxide, tin oxide, cadmium oxide, titanium oxide, indium oxide or indium tin oxide (ITO). The at least one functional layer preferably comprises an organic functional layer, in particular an organic electroluminescent layer. The radiation-emitting device can in particular be an organic light-emitting diode (OLED) or comprise such a diode.

The at least one functional layer can comprise in particular an organic functional layer stack having an organic electroluminescent layer. The organic functional layer stack can have, for example, a hole injection layer, a hole transport layer, an electron blocking layer, a hole blocking layer, an electron transport layer and/or an electron injection layer for conducting holes or electrons, respectively, to the organic electroluminescent layer or blocking the respective transport. Suitable layer constructions for the organic functional layer stack are known and, therefore, will not be explained any further here.

The substrate can comprise or consist of, for example, glass, quartz, a plastics foil, metal, a metal foil, a silicon wafer or some other suitable substrate material.

The first electrode area can comprise at least one contact via which a voltage can be applied to the first electrode area. The at least one contact of the first electrode area is preferably arranged at an edge or in the vicinity of an edge of the first electrode area.

By virtue of the fact that the first electrode area is interrupted by at least one removal region, the resistance between two respective points of the first electrode area is increased compared to when the electrode area is present with full thickness throughout. The resistance between two points of the first electrode area is increased all the more. The longer the path that has to be taken by the current on account of the interruption by the at least one removal region and the narrower the region via which the first electrode area conductively connects the two points to one another.

Emission of radiation by the radiation-emitting device is based on the fact that a current flows between the first electrode area and the second electrode area. The current is passed from the contacts of the first electrode area via the first electrode area into the first electrode area to flow from there via the functional layer into the second electrode area and excite emission of radiation in the process. Radiation intensity increases with the current flowing from the first electrode area to the second electrode area, and the current in turn increases with the potential difference existing between the first electrode area and the second electrode area. In this case, on account of the sheet resistance of the first and second electrode areas, there is a voltage drop between the contacts of the electrode areas and points in the interior of the electrode areas. The local current flow from the first electrode area to the second electrode area depends on the local potential difference between the first electrode area and the second electrode area. The local potential difference is smaller at a given point, the larger the voltage drop between the contacts of the electrode areas and the point of the electrode areas.

Consequently, by virtue of the fact that the resistance between the at least one contact of the first electrode area and points in the interior of the first electrode area is increased on account of the at least one removal region, the radiation intensity is reduced. The radiation intensity at a point is reduced to a greater extent, the greater the extent to which the current flow between the point and the contact of the first electrode area is interrupted by the at least one removal region. Consequently, the intensity profile along the extent of the first and second electrode areas can be determined by the form of the at least one removal region. In particular, it is thus possible to achieve a continuous transition between different gray levels in different regions of the radiation-emitting device.

The at least one removal region is preferably linear. The width of a linear removal region is preferably constant along the course thereof. The constant width is preferably 25 µm to 100 µm, particularly preferably 40 µm to 60 µm. The linear removal region can have the form of a straight section. Preferably, the linear removal region has changes of direction over its course. A plurality of linear removal regions is also possible.

Optionally, the at least one removal region can be areal. Preferably, an areal removal region has a width of at least 1 mm, particularly preferably of at least 1 cm, in each direction.

Preferably, at least one conduction region in which the first electrode area is not removed or has at least more than half of its nominal thickness is arranged between two removal regions or two parts of a removal region. The conduction region preferably conductively connects to the at least one contact of the first electrode area by the first electrode area. The conduction region is preferably continuous. Preferably, the conduction region has a constant width at least over part of its course. The constant width is preferably 1 mm to 10 cm, particularly preferably 5 mm to 2 cm. The conduction region can extend in a specific direction or its direction can change over its course. Preferably, the distance between the removal regions or parts of a removal region that delimit the conduction region remains constant here over the course of the conduction region. Part of the boundary of a conduction region can be formed by a continuous removal region. Optionally, part of the boundary of a conduction region can be formed by two or more removal regions separated from one another by regions in which the first electrode area is not removed.

Preferably, the at least one conduction region conductively connects to the at least one contact of the first electrode area via non-removed parts of the first electrode area. Preferably, more than 50%, particularly preferably more than 80% and particularly preferably more than 90% of the boundary of a conduction region is formed by one or a plurality of removal regions. The parts of the boundary of a conduction region not formed by removal regions form opening regions via which the conduction region conductively connects to the at least one contact of the first electrode area. If the boundary of a conduction region has only one opening region, then the radiation intensity decreases from the opening region toward the interior of the conduction region. The radiation intensity at a point of the conduction region is lower, the greater the effective resistance of the first electrode area and thus the voltage drop in the first electrode area between the point and the opening region. A minimum radiation intensity within the conduction region occurs when the voltage drop in the first electrode area relative to the opening region is the greatest. If the boundary of a conduction region has a plurality of opening regions, then the radiation intensity decreases from the opening regions toward the interior of the conduction region. In this case, a minimum radiation intensity within the conduction region occurs at a distance from all opening regions, for example, at the same distance from all opening regions given a symmetrical example of the conduction region and of the opening regions.

Preferably, the at least one conduction region has the form of at least one letter, at least one numeral or at least one logo, wherein one or a plurality of conduction regions in letter form can form one or a plurality of words and/or one or a plurality of conduction regions in numeral form can form one or a plurality of numbers. In a further example, at least one conduction region can be spiral.

The first electrode area preferably has a thickness of 20 nm to 1 µm, particularly preferably of 100 nm to 200 nm and particularly preferably of 100 nm to 170 nm. The first electrode area is preferably completely removed in the at least one removal region. Optionally, the first electrode area can be only partly removed in the removal region, for example, to half of its thickness.

That region of the electrode area in which removal regions are arranged preferably comprises at least 50% of the entire luminous area. The entire luminous area is preferably 10 cm² to 1000 cm², particularly preferably 50 cm² to 200 cm² and particularly preferably 100 cm² to 150 cm². The luminous area can be, for example, rectangular, for example, with a length of 15 cm and a width of 9 cm, or square with a length and width of in each case 10 cm, for example.

The substrate is preferably transparent or translucent to the electromagnetic radiation generated by the at least one functional layer. In particular, the substrate can be a glass substrate. Preferably, electromagnetic radiation emerges from that side of the substrate facing away from the first electrode area. Optionally, that side of the substrate facing away from the first electrode area can be reflectively coated. Optionally or additionally, electromagnetic radiation can emerge from that side of the second electrode area facing away from the substrate. In this case, the second electrode area is preferably transparent or translucent. The radiation-emitting device can thus be a top emitter or a bottom emitter or emit electromagnetic radiation in both directions.

My method of producing a radiation-emitting device may comprise providing a first electrode area on a substrate, at least partly removing the first electrode area in at least one removal region, applying at least one functional layer that generates electromagnetic radiation in a switched-on operating state on the first electrode area, and applying a second electrode area on the at least one functional layer, wherein, during the process of at least partly removing the first electrode area, at least one removal region is arranged between at least two points of the first electrode area conductively connected to one another by the first electrode area.

The process of at least partly removing the first electrode area can comprise laser ablation. In this case, the diameter of the laser beam is preferably 25 µm to 100 µm, particularly preferably 60 µm or less. The laser can be a diode-pumped solid-state laser. The laser can generate laser radiation in the UV range, for example, having a wavelength of 370 nm. The power of the laser can be 1 W to 4 W, for example.

The process of removing the first electrode area using a laser is suitable in particular to form linear removal regions. In this case, the diameter of the laser beam substantially corresponds to the line width of the linear removal regions. In this way, areal intensity variations can be achieved, for example, by a programmable mechanical movement of the laser without an areal variation in the physical properties of the layer sequence having to be brought about.

Optionally or additionally, the process of at least partly removing the first electrode area can comprise etching. The etching can comprise wet-chemical etching, in particular photochemical etching using a mixture of nitric acid and iron(III) chloride. Optionally or additionally, the etching can comprise dry etching, in particular plasma etching. Etching affords the advantage over laser ablation that it is simpler to avoid damage to the glass substrate, remove only parts of the first electrode area as necessary and/or produce areal removal regions as necessary.

Further advantages and developments will become apparent from the examples described below in association with the figures.

In the examples and figures, elements that are identical, of identical type or act identically may be provided with the same reference signs. The illustrated elements and their size relationships among one another should not be regarded as true to scale. Rather, individual elements such as, for example, layers, structural parts, components and regions may be illustrated with more than proportional size to enable better illustration and/or to afford a better understanding. This can relate to individual dimensions or to all dimensions of the elements.

Figure 1:
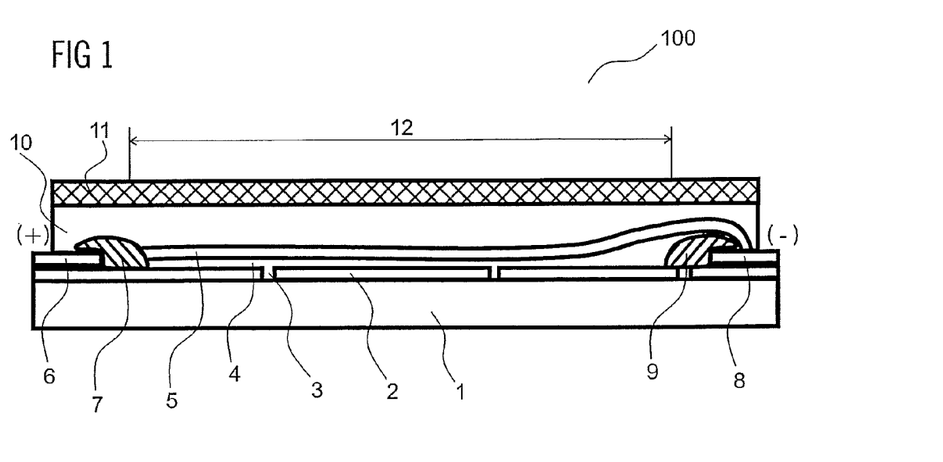
FIG. 1 shows a sectional view of a radiation-emitting device according to a first example.

FIG. 1 shows a first example of a radiation-emitting device, the radiation-emitting device being designated in its entirety by 100 on the basis of a schematic side view. The radiation-emitting device 100 comprises a glass substrate 1. A first electrode area 2 is arranged on the glass substrate 1, which first electrode area can consist of indium tin oxide, for example. The first electrode area 2 is removed in removal regions 3. In this case, the first electrode area 2 is completely removed in the removal regions 3, that is to say that the first electrode area 2 is not present in the removal regions 3. Optionally, the first electrode area 2 can be only partly removed in the removal regions 3; by way of example, the first electrode area 2 can have half of its nominal thickness in the removal regions 3.

A functional layer 4, for example, an organic functional layer, is arranged on the first electrode area 2, the functional layer suitable to generate electromagnetic radiation in a switched-on operating state. A second electrode area 5 is arranged on the functional layer 4. The second electrode area 5 can consist of indium tin oxide, for example.

At an edge of the radiation-emitting device 100, a first contact 6 is arranged on the first electrode area 2, the first contact conductively connected to the first electrode area 2. The first contact 6 is electrically insulated from the functional layer 4 and the second electrode area 5 by a resistance 7. At the opposite edge of the radiation-emitting device 100, a second contact 8 is arranged on the first electrode area 2, the second contact being insulated from the first electrode area 2. The second contact 8 conductively connects to the second electrode area 5 and is electrically insulated from the functional layer 4 by a resistance 9.

In the operating state, a positive voltage is applied to the first contact 6, and a negative voltage is applied to the second contact 8. The first electrode area 2 thus acts as an anode, and the second electrode area 5 acts as a cathode.

A terminating glass layer 11 is arranged on the second electrode area 5 with the aid of an adhesive layer 10. The radiation-emitting device 100 is designed to emit electromagnetic radiation in an active region 12. The active region 12 thus forms the luminous area of the radiation-emitting device 100.

In the first example, both electrode areas 2, 5 are transparent and the radiation-emitting device 100 has transparent glass surfaces 10, 16 on both sides such that the device 100 can emit electromagnetic radiation in both directions perpendicularly to the layer sequence.

Optionally, one or both of the electrode areas 2, 5 can be translucent. Optionally, one of the outer surfaces can be reflectively coated and/or one of the electrode areas 2, 5 can consist of a metal such that the device 100 emits electromagnetic radiation only in one of the two directions perpendicularly to the layer sequence.

Figure 2:
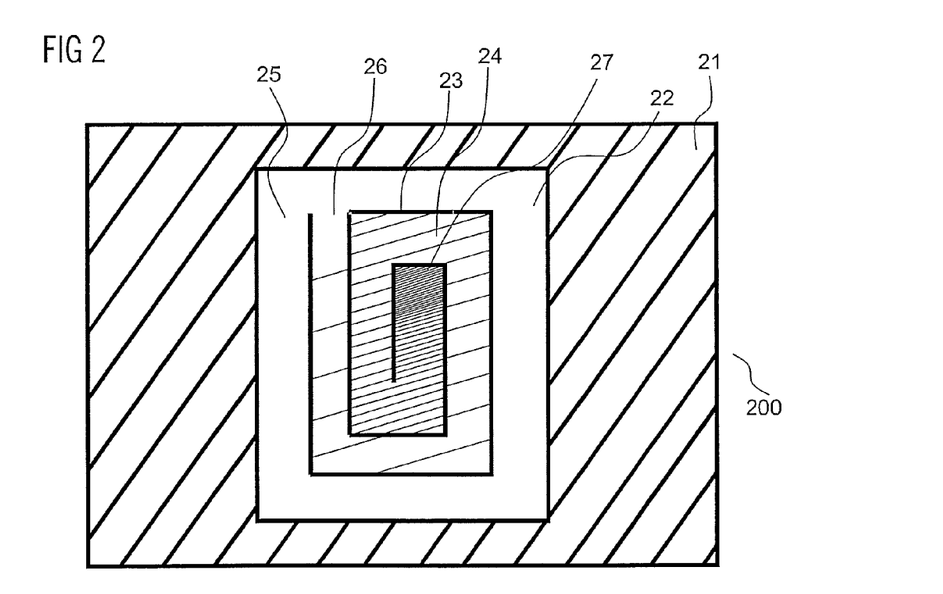
FIG. 2 shows a plan view of a radiation-emitting device according to a second example.

FIG. 2 shows a second example of a radiation-emitting device, the radiation-emitting device designated in its entirety by 200 on the basis of a schematic plan view. The radiation-emitting device 200 has a non-active region 21 on the outside and an active region 22 on the inside. In the active region 22, the radiation-emitting device 200 emits electromagnetic radiation. In the active region, the first electrode area is removed along a line 23. In this case, the line 23 has the form of a right-angled spiral. The line 23 delimits a conduction region 24, which likewise has a spiral shape on account of the spiral shape of the line 23. By virtue of the fact that successive turns of the spiral line 23 run at a constant distance from one another, the conduction region delimited by the line 23 has a constant width. The first electrode area is not removed in the conduction region 24 and in an outer region 25. Between the first electrode area in the conduction region 24 and the first electrode area in the outer region 25 there is a conductive connection via the opening region 26 in which the first electrode area is likewise not removed. Contacts (not shown) are situated in the outer region 25, via which contacts a voltage is applied to the first electrode area in the operating state.

In the operating state, a current flows between the first electrode area and the second electrode area. For this purpose, a current must flow into the first electrode area from the contacts of the first electrode area. On account of the sheet resistance of the first electrode area, a voltage is dropped along the current flow in the first electrode area. By virtue of the fact that the conduction region 24 is demarcated from the outer region 25 by the line 23 along which the first electrode area is removed, between the conduction region 24 and the contacts arranged in the outer region 25 there is a greater electrical resistance than would be the case with a first electrode area being conductive throughout. In particular, by virtue of the fact that the line 23 is spiral, the effective resistance and thus the voltage drop between a point of the first electrode area in the conduction region 24 and the contacts arranged in the outer region is greater, the further the point lies in the interior of the spiral. As a result of the increasing voltage drop, less and less voltage to excite the emission of radiation is available toward the interior of the spiral. This results in a continuous gray-level profile from a maximum emission intensity in the outer region 25 through decreasing emission intensity along the spiral course of the conduction region 24 to a location 27 of minimum emission intensity right in the interior of the spiral, at which the voltage drop relative to the contacts arranged in the outer region is the greatest. The varying emission intensity is represented by varying hatchings in the drawing.

Figure 3:
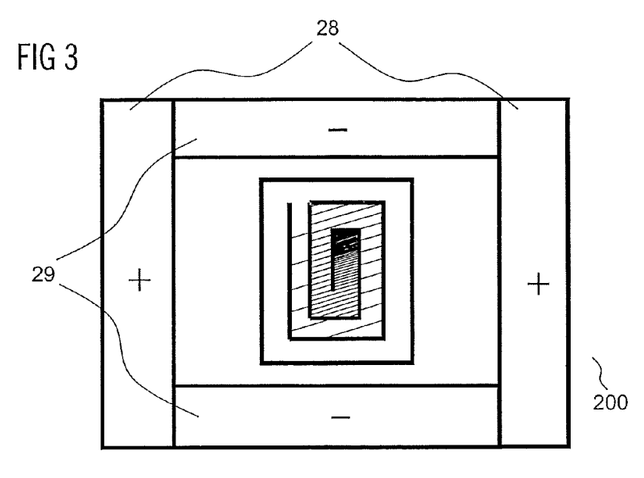
FIG. 3 shows a schematic illustration of one possible contacting of the radiation-emitting device in accordance with the second example.

FIG. 3 shows a schematic illustration of one possible contacting of the radiation-emitting device 200 in accordance with the second example. The radiation-emitting device has two contacts 28 at two opposite edges and two further contacts 29 at the other two opposite edges. In the operating state, the potential applied to the contacts 28 is higher than that applied to the contacts 29. The contacts 28 connect to two edges of the first electrode area, which thus acts as a cathode. The contacts 29 conductively connect to two edges of the second electrode area, which thus acts as an anode. There is no conductive connection between the contacts 28 and the contacts 29 such that a current can flow from the contacts 28 to the contacts 29 only via the layer sequence. The example is not restricted to this form of contacting. The contacts can also be arranged, for example, only at one edge or at two mutually adjoining edges of the two electrode areas.

Figure 4:
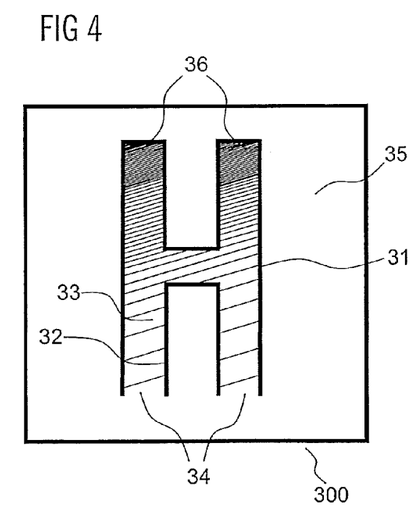
FIG. 4 shows a plan view of a radiation-emitting device according to a third example.

FIG. 4 shows a third example of a radiation-emitting device, the radiation-emitting device designated in its entirety by 300 on the basis of a schematic plan view. In this example, the first electrode area is removed along two lines 31 and 32. The lines 31 and 32 are separated from one another by regions in which the first electrode area is not removed. The lines 31 and 32 jointly demarcate a conduction region 33. The conduction region 33 connects via two opening regions 34 to an outer region 35 in which the contacts of the first electrode area (not shown) are arranged. The first electrode area is not removed in the conduction region 33 and the outer region 35. By virtue of the fact that the conduction region 33 is demarcated from the outer region 35 by the lines 31 and 32, the resistance between the conduction region 33 and the contacts of the first electrode area is greater than would be the case with a first electrode area being conductive throughout.

In this case, the conduction region 33 has the form of the upper-case letter H. The voltage drop relative to the contacts of the first electrode area increases from the opening regions 34 toward the interior of the conduction region 33 such that the intensity of the emitted radiation decreases from a maximum emission intensity in the outer region 35 along the conduction region 33. Radiation having a minimum emission intensity is emitted at the ends 36 of the conduction region 33 that are the furthest away from the opening regions 34. In this example, too, the conduction region 33 has a constant width because the lines 31 and 32 are arranged such that respectively adjacent parts thereof run at a constant distance from one another. In this case, the conduction region 33 is delimited in some partial regions by the line 31 on one side and by the line 32 on the other side, while the conduction region is delimited in other partial regions by different parts of the line 31 on both sides.

Figure 5:
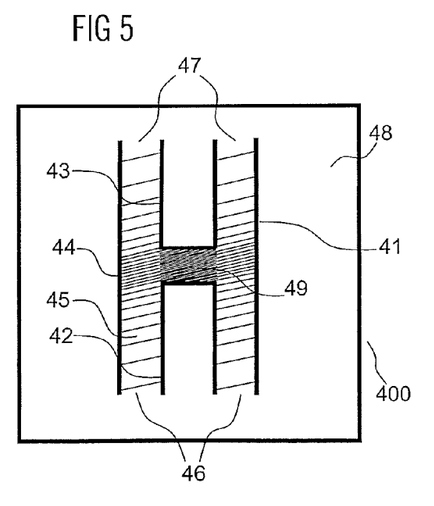
FIG. 5 shows a plan view of a radiation-emitting device according to a fourth example.

FIG. 5 shows a fourth example of a radiation-emitting device, the radiation-emitting device designated in its entirety by 400, on the basis of a schematic plan view. In this example, the first electrode area is removed along four lines 41, 42, 43 and 44. The lines 41 to 44 are separated from one another by regions in which the first electrode area is not removed. The lines 41 to 44 jointly demarcate a conduction region 45. The conduction region 45 connects via four opening regions 46, 47 to an outer region 48 in which the contacts of the first electrode area (not shown) are arranged. The first electrode area is not removed in the conduction region 45 and the outer region 48. By virtue of the fact that the conduction region 45 is demarcated from the outer region 48 by the lines 41 to 44, the resistance between the conduction region 45 and the contacts of the first electrode area is greater than would be the case with a first electrode area being conductive throughout.

In this case, too, the conduction region 45 has the form of the upper-case letter H. In contrast to the conduction region 33 of the radiation-emitting device 300 of the third example, the conduction region 45 of the radiation-emitting device 400 of the fourth example connects to the outer region 48 via two additional opening regions 47. This results in a different voltage profile and thus also a different intensity profile in the interior of the conduction region 45. The voltage drop relative to the contacts of the first electrode area increases from the opening regions 46, 47 toward the interior of the conduction region 45 such that the intensity of the emitted radiation decreases from a maximum emission intensity in the outer region 48 along the conduction region 45. Radiation having a minimum emission intensity is emitted at the center 49 of the conduction region 45, the center being the furthest away from the opening regions 46, 47. In this example, too, the conduction region 33 has a constant width because the lines 41 to 44 are arranged such that respectively adjacent parts thereof run at a constant distance from one another. In contrast to the third example, in this fourth example each partial region of the conduction region 45 is delimited by two different lines of the lines 41 to 44.

My devices are not limited to an individual conduction region. In different parts of the first electrode area, a plurality of conduction regions can be demarcated by one or a plurality of removal regions. By way of example, each conduction region can have the form of a letter as shown in the third and fourth examples and the conduction regions together can form one or a plurality of words. The conduction regions can also have the form of numerals and together form one or a plurality of numbers. On account of the reduced emission intensity in the interior of the conduction regions, the words and/or numbers formed by the conduction regions can be legible to an observer of the radiation-emitting device. Such a radiation-emitting device can be used in a plate, for example. Radiation-emitting devices can additionally be used in decorative elements, for brand identification and for representing logos or mottos.

This application claims priority of DE 10 2013 110 666.8, the subject matter of which is hereby incorporated by reference.

The invention claimed is:

1. A radiation-emitting device comprising:
   a substrate; and
   at least one layer sequence arranged on the substrate that generates electromagnetic radiation, comprising:
      at least one first electrode area,
      at least one second electrode area, and
      at least one organic functional layer between the first electrode area and the second electrode area,
   wherein the organic functional layer generates electromagnetic radiation in a switched-on operating state,
   at least one removal region is arranged between at least two points of the first electrode area conductively connected to one another by the first electrode area, the first electrode area being partly removed in said at least one removal region so that the first electrode area comprises a depression in the removal region,
   the depression is filled with the organic functional layer,
   the first electrode area having a non-zero thickness in the at least one removal region smaller than a thickness of the first electrode area where it is not removed and completed present,
   at least one conduction region in which the first electrode area is not removed is arranged between two removal regions or two parts of a removal region, and
   the conduction region has a constant width of 1 mm to 10 cm at least over a part of its course.

2. The radiation-emitting device according to claim 1, wherein the radiation-emitting device is an organic light-emitting device.

3. The radiation-emitting device according to claim 1, wherein at least one removal region is linear.

4. The radiation-emitting device according to claim 1, wherein at least one removal region is areal.

5. The radiation-emitting device according to claim 1, wherein at least one conduction region in which the first electrode area is not removed is arranged between two removal regions or two parts of a removal region.

6. The radiation-emitting device according to claim 5, wherein at least one conduction region has a constant width at least over part of its course.

7. The radiation-emitting device according to claim 5, wherein at least 90% of the boundary of at least one conduction region is fainted by at least one removal region.

8. The radiation-emitting device according to claim 5, wherein the boundary of at least one conduction region comprises exactly one opening region in which the first electrode area is not removed.

9. The radiation-emitting device according to claim 5, wherein the boundary of at least one conduction region comprises a plurality of opening regions in which the first electrode area is not removed.

10. A method of producing a radiation-emitting device comprising:
    providing a first electrode area on a substrate,
    partly removing the first electrode area in at least one removal region so that a depression in the first electrode area is formed,
    applying at least one organic functional layer that generates electromagnetic radiation in a switched-on operating state, on the first electrode area so that the at least one organic functional layer fills the depression, and
    applying a second electrode area on the at least one organic functional layer,
    wherein, during the process of partly removing the first electrode area, at least one removal region is arranged between at least two points of the first electrode area conductively connected to one another by the first electrode area,
    the first electrode area is partly removed in the at least one removal region such that the first electrode area has a non-zero thickness in the at least one removal region smaller than a thickness of the first electrode area where it is not removed and completely present,
    at least one conduction region in which the first electrode area is not removed is arranged between two removal regions or two parts of a removal region, and
    the conduction region has a constant width of 1 mm to 10 cm at least over a part of its course.

11. The method according to claim 10, wherein the process of at least partly removing the first electrode area comprises laser ablation.

12. The method according to claim 10, wherein the process of at least partly removing the first electrode area comprises etching.

13. The method according to claim 12, wherein the etching comprises wet-chemical etching.

14. The method according to claim 13, wherein the wet-chemical etching comprises photochemical etching using a mixture of nitric acid and iron(III) chloride.

15. The method according claim 12, wherein the etching comprises dry etching.

16. A radiation-emitting device comprising:
    a substrate; and
    at least one layer sequence arranged on the substrate that generates electromagnetic radiation, comprising:
       at least one first electrode area,
       at least one second electrode area, and
       at least one functional layer between the first electrode area and the second electrode area, wherein the functional layer generates electromagnetic radiation in a switched-on operating state, at least one removal region is arranged between at least two points of the first electrode area conductively connected to one another by the first electrode area, the first electrode area being partly removed in said at least one removal region, the first electrode area having a non-zero thickness in the at least one removal region smaller than a thickness of the first electrode area, where it is not removed and completely present, at least one conduction region in which the first electrode area is not removed is arranged between two removal regions or two parts of a removal region, and at least 90% of the boundary of the at least one conduction region is formed by at least one removal region and the boundary of the at least one conduction region comprises exactly one opening or a plurality of openings in which the first electrode area is not removed such that a radiation intensity of the radiation emitting device decreases from the openings toward the interior of the conduction region.

\* \* \* \* \*

UNITED STATES PATENT AND TRADEMARK OFFICE
CERTIFICATE OF CORRECTION

PATENT NO. : 9,780,151 B2
APPLICATION NO. : 15/023725
DATED : October 3, 2017
INVENTOR(S) : Andrew Ingle Page 1 of 1

It is certified that error appears in the above-identified patent and that said Letters Patent is hereby corrected as shown below:

In the Claims

At Column 9, at Line 55, please change "completed present" to -- completely present --.

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*